(12) United States Patent
Xie et al.

(10) Patent No.: US 11,508,942 B2
(45) Date of Patent: Nov. 22, 2022

(54) OLED DISPLAY SUBSTRATE AND MANUFACTURING METHOD THEREOF, OLED DISPLAY DEVICE, AND BRIGHTNESS COMPENSATION METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuewu Xie, Beijing (CN); Bowen Liu, Beijing (CN); Chienyu Chen, Beijing (CN); Yu Al, Beijing (CN); Hao Liu, Beijing (CN); Yubao Kong, Beijing (CN); Shi Sun, Beijing (CN); Ameng Zhang, Beijing (CN)

(73) Assignees: HEFEI XINSHENG OPTOELECTRONICS TECHNOLOGY CO., LTD., Hefei (CN); Beijing BOE Technology Development Co., Ltd., Beijing (CN)

( * ) Notice: Subject to any disclaimer, the term of this patent is extended or adjusted under 35 U.S.C. 154(b) by 45 days.

(21) Appl. No.: 17/040,952

(22) PCT Filed: Apr. 10, 2020

(86) PCT No.: PCT/CN2020/084174
§ 371 (c)(1),
(2) Date: Sep. 23, 2020

(87) PCT Pub. No.: WO2020/207463
PCT Pub. Date: Oct. 15, 2020

(65) Prior Publication Data
US 2021/0020869 A1 Jan. 21, 2021

(30) Foreign Application Priority Data
Apr. 10, 2019 (CN) .......................... 201910285986.4

(51) Int. Cl.
*G09G 3/20* (2006.01)
*G09G 3/3225* (2016.01)
(Continued)

(52) U.S. Cl.
CPC ....... *H01L 51/5275* (2013.01); *G09G 3/2007* (2013.01); *G09G 3/3225* (2013.01);
(Continued)

(58) Field of Classification Search
CPC ............... G09G 3/2007; G09G 3/3225; G09G 2320/0626; H01L 51/5275
See application file for complete search history.

(56) References Cited

U.S. PATENT DOCUMENTS

2010/0221855 A1 9/2010 Yamazaki et al.
2015/0188093 A1 7/2015 Kim et al.
(Continued)

FOREIGN PATENT DOCUMENTS

CN 103915482 A 7/2014
CN 104037357 A 9/2014
(Continued)

OTHER PUBLICATIONS

ISA China National Intellectual Property Administration, International Search Report and Written Opinion Issued in Application No. PCT/CN2020/084174, dated Jul. 20, 2020, WIPO, 15 pages. (Submitted with Partial Translation).
(Continued)

*Primary Examiner* — Kevin M Nguyen
(74) *Attorney, Agent, or Firm* — McCoy Russell LLP

(57) ABSTRACT

The present disclosure relates to an OLED display substrate including a base substrate, a thin film transistor array layer and a planarization layer on the base substrate, and an anode, a pixel definition layer, a cathode, and a light emitting layer on a side of the planarization layer away from the base
(Continued)

substrate, the pixel definition layer defining pixel regions, the light emitting layer being located on a side of the pixel definition layer away from the base substrate. The display substrate further includes a light guide that is in contact with the light emitting layer and is used to lead out light from the light emitting layer, so as to test the led-out light and adjust light emission.

18 Claims, 9 Drawing Sheets

(51) Int. Cl.
  *H01L 51/52* (2006.01)
  *H01L 27/32* (2006.01)
  *H01L 51/56* (2006.01)
(52) U.S. Cl.
  CPC ...... *H01L 27/3246* (2013.01); *H01L 27/3258* (2013.01); *H01L 51/56* (2013.01); *G09G 2320/0626* (2013.01); *G09G 2360/147* (2013.01); *H01L 2227/323* (2013.01)

(56) References Cited

U.S. PATENT DOCUMENTS

| | | |
|---|---|---|
| 2016/0181342 A1 | 6/2016 | Choi et al. |
| 2016/0276418 A1 | 9/2016 | Xu et al. |
| 2016/0276807 A1 | 9/2016 | Cai et al. |
| 2016/0293894 A1 | 10/2016 | Cheng et al. |
| 2017/0012086 A1 | 1/2017 | Kim et al. |
| 2017/0084774 A1* | 3/2017 | Im .................. H01L 31/153 |
| 2017/0223233 A1* | 8/2017 | Jung .................. G09G 3/006 |
| 2018/0226016 A1* | 8/2018 | Suzuki .................. H05B 33/22 |
| 2019/0103584 A1 | 4/2019 | Chen et al. |
| 2019/0237009 A1 | 8/2019 | Chu |
| 2021/0020869 A1 | 1/2021 | Xie et al. |

FOREIGN PATENT DOCUMENTS

| | | |
|---|---|---|
| CN | 104183624 A | 12/2014 |
| CN | 204375795 U | 6/2015 |
| CN | 204437914 U | 7/2015 |
| CN | 105720078 A | 6/2016 |
| CN | 105990391 A | 10/2016 |
| CN | 107316609 A | 11/2017 |
| CN | 107689426 A | 2/2018 |
| CN | 107851408 A | 3/2018 |
| CN | 109950295 A | 6/2019 |
| JP | 2006053472 A | 2/2006 |

OTHER PUBLICATIONS

State Intellectual Property Office of the People's Republic of China, Office Action and Search Report Issued in Application No. 201910285986.4, dated Aug. 31, 2020, 11 pages. (Submitted with Partial Translation).

\* cited by examiner

US 11,508,942 B2

OLED DISPLAY SUBSTRATE AND MANUFACTURING METHOD THEREOF, OLED DISPLAY DEVICE, AND BRIGHTNESS COMPENSATION METHOD

CROSS-REFERENCE TO RELATED APPLICATIONS

The present application is a U.S. National Phase of International Patent Application Serial No. PCT/CN2020/084174 entitled "OLED DISPLAY SUBSTRATE AND MANUFACTURING METHOD THEREOF, OLED DISPLAY DEVICE, AND BRIGHTNESS COMPENSATION METHOD," filed on Apr. 10, 2020. International Patent Application Serial No. PCT/CN2020/084174 claims priority to Chinese Patent Application No. 201910285986.4 filed on Apr. 10, 2019. The entire contents of each of the above-referenced applications are hereby incorporated by reference for all purposes.

TECHNICAL FIELD

The present disclosure relates to the field of display product manufacturing technology, and in particular to an OLED display substrate and a manufacturing method thereof, an OLED display device, and a brightness compensation method.

BACKGROUND AND SUMMARY

At present, voltage driving mode is usually adopted as active driving mode for OLED (Organic Light-Emitting Diode) devices. Compared with current driving, voltage driving can be implemented with simple structure, suitable for large-size display, and has high driving speed. On the other hand, the scheme of voltage driving needs to compensate for non-uniformity of Thin Film Transistors (TFTs), power supply voltage drop, and uneven display brightness caused by the non-uniformity of OLED. The current driving mode realizes the grayscale control by directly providing certain current, which can compensate the non-uniformity of the TFTs and the power supply voltage drop well. However, the writing time for low grayscale current is too long and the structure is complicated. The digital driving mode uses the light-emitting time modulation method to achieve different gray levels, that is, the longer the light-emitting time per unit time, the greater the duty cycle, and the higher the brightness perceived by human eyes. However in such driving mode, the circuit is frequently switched, resulting in high power consumption, and more grayscales cannot be realized due to the scanning speed and its scanning drive structure.

The present disclosure provides an OLED display substrate which includes: a base substrate, a thin film transistor array layer and a planarization layer on the base substrate, and an anode, a pixel definition layer, a cathode, and a light emitting layer on a side of the planarization layer away from the base substrate, the pixel definition layer defining pixel regions, the light emitting layer being located on a side of the pixel definition layer away from the base substrate, the display substrate further including a light guide that is in contact with the light emitting layer and is used to lead out light from the light emitting layer, so as to test the led-out light and adjust light emission.

Optionally, the pixel definition layer includes a first pixel definition sub-layer and a second pixel definition sub-layer stacked in a direction away from the base substrate, the light guide is located between the first pixel definition sub-layer and the second pixel definition sub-layer, and the light guide includes a contact portion exposed outside the pixel definition layer to be in contact with the light emitting layer.

Optionally, a refractive index of the light guide is greater than a refractive index of the pixel definition layer.

Optionally, the light guide includes a first side in contact with the light emitting layer and a second side opposite to the first side, the contact portion is located on the first side, and a concave-convex structure is provided on the second side so that light entering the light guide is totally reflected on the second side.

Optionally, the light guide includes a plurality of row light guides arranged in parallel with data lines, a number of the row light guides is equal to a number of rows of the pixel regions, and each row of the pixel regions is connected to one corresponding row light guide.

Optionally, the light guide further includes at least one column light guide, and the at least one column light guide intersects the row light guides.

Optionally, the thin film transistor array layer includes a gate insulation layer, a first planarization layer, an etching stop layer, a passivation layer, and a second planarization layer provided on the base substrate;
 a first opening is provided at a first position of the gate insulation layer, the first planarization layer is located in the first opening;
 a second opening is provided at a second position of the etching stop layer and the passivation layer, the second opening penetrates the etching stop layer and the passivation layer, a portion of the etching stop layer in the second opening forms a first etching stop sub-layer, the second planarization layer is filled between the first etching stop sub-layer and rest of the etching stop layer, a portion of the passivation layer in the second opening forms a first passivation sub-layer, the second planarization layer is filled between the first passivation sub-layer and rest of the passivation layer;
 the second planarization layer has a third opening at the second position to expose the first passivation sub-layer, the first etching stop sub-layer and the first passivation sub-layer constitutes the light guide, wherein the light guide further includes an anode which is provided between the first passivation sub-layer and the light emitting layer,
 wherein orthographic projections of the second and third openings on the base substrate fall within an orthographic projection of the first opening on the base substrate.

Optionally, a refractive index of the etching stop layer is greater than a refractive index of the first planarization layer, the refractive index of the etching stop layer is greater than a refractive index of the second planarization layer, a refractive index of the passivation layer is greater than the refractive index of the first planarization layer, and the refractive index of the passivation layer is greater than the refractive index of the second planarization layer.

Optionally, the thin film transistor array layer includes a gate insulation layer, a gate, a first metal film layer, an etching stop layer, a passivation layer, a second metal film layer, and a planarization layer provided on the base substrate;
 the first metal film layer and the gate are manufactured in a same layer and formed at a first position;
 a fourth opening is provided at a second position of the etching stop layer and the passivation layer, the fourth opening penetrates the etching stop layer and the passivation layer, a portion of the etching stop layer in the fourth opening forms a second etching stop sub-layer, the second metal film layer is filled between the second etching stop sub-layer and rest of the etching stop layer, a portion of the passivation layer in the fourth opening forms a second passivation sub-layer, the second metal film layer is filled between the second passivation sub-layer and rest of the passivation layer;

the planarization layer has a fifth opening at the second position to expose the second passivation sub-layer;

the second etching stop sub-layer and the second passivation sub-layer constitutes the light guide, wherein an orthographic projection of the fifth opening on the base substrate falls within an orthographic projection of the fourth opening on the base substrate.

The present disclosure further provides a manufacturing method of an OLED display substrate including:

forming a thin film transistor array layer on a base substrate;

forming a planarization layer;

forming an anode and a pixel definition layer on a side of the planarization away from the base substrate;

forming a light emitting layer on a side of the pixel definition layer away from the base substrate;

forming a light guide, the light guide being in contact with the light emitting layer and used to lead out light from the light emitting layer to test the led-out light and adjust light emission; and forming a cathode on the light emitting layer.

Optionally, the pixel definition layer includes a first pixel definition sub-layer and a second pixel definition sub-layer, and after the step of forming the planarization layer, the method includes:

forming the anode and performing patterning process;

forming the first pixel definition sub-layer and performing patterning process;

forming the light guide on the first pixel definition sub-layer and performing patterning process;

forming the second pixel definition sub-layer on the first pixel definition sub-layer and the light guide, and performing patterning process;

forming the light emitting layer on the second pixel definition sub-layer; and forming the cathode on the light emitting layer.

Optionally, the light guide is composed of a passivation layer and an etching stop layer, and the method includes:

forming a gate layer and a gate insulation layer on the base substrate;

etching the gate insulation layer at a first position to form a first opening;

forming a first planarization layer in the first opening;

forming the etching stop layer and the passivation layer;

etching the passivation layer and the etching stop layer to form a second opening penetrating the passivation layer and the etching stop layer, a portion of the etching stop layer in the second opening forming a first etching stop sub-layer, a portion of the passivation layer in the second opening forming a first passivation sub-layer;

forming a second planarization layer, a part of the second planarization layer filled in the second opening and the first passivation layer are in contact with each other, so as to cover the first passivation sub-layer and the first etching stop sub-layer;

etching the second planarization layer at a second position to form a third opening exposing the first passivation sub-layer.

Optionally, the light guide is composed of a passivation layer and an etching stop layer, and the method includes:

forming a gate and a first metal film layer in a same layer on the base substrate, wherein the first metal film layer is formed at a first position;

forming a gate insulation layer, a passivation layer and an etching stop layer; performing patterning process on the passivation layer and the etching stop layer to form a fourth opening, a portion of the etching stop layer in the fourth opening forming a second etching stop sub-layer, a portion of the passivation layer in the fourth opening forming a second passivation sub-layer;

forming a second metal film layer in the fourth opening, the second metal film layer being filled between the second etching stop sub-layer and rest of the etching stop layer and filled between the second passivation sub-layer and rest of the passivation layer;

forming the planarization and performing patterning process to form a fifth opening;

forming the node, the pixel definition layer, the cathode, and the light emitting layer in pixel regions defined by the pixel definition layer.

The present disclosure further provides an OLED display device, including the above OLED display substrate and a brightness compensation mechanism which is connected to the light guide to collect brightness information of the light emitting layer and compensates brightness of a corresponding pixel region according to the brightness information.

Optionally, the brightness compensation mechanism includes:

a brightness information collection module configured to collect the brightness information of the light emitting layer in each pixel region, the brightness information including brightness corresponding to a plurality of grayscales in one-to-one manner;

a grayscale brightness curve acquisition module configured to acquire a measured grayscale brightness curve according to the brightness information;

a grayscale compensation value acquisition module configured to compare the measured grayscale brightness curve with a standard grayscale brightness curve to acquire a grayscale compensation value of a preset grayscale;

a compensation module configured to perform brightness compensation according to the grayscale compensation value.

Optionally, the OLED display device further includes a brightness correction module which includes:

a standard photoelectric sensor connected to the light guide to acquire a measured brightness L1 of the light emitting layer in a current pixel region;

an image sensor configured to acquire an actual brightness L2 of the current pixel region;

a brightness correction coefficient acquisition unit configured to acquire a brightness correction coefficient $A=L2/L1$ according to the measured brightness L1 and the actual brightness L2;

the brightness information acquired by the brightness information collection module is a product of a first brightness acquired through the light guide and the brightness correction coefficient.

The present disclosure further provides a brightness compensation method applied to the above OLED display device, including steps of:

collecting the brightness information of the light emitting layer in each pixel region;

acquiring a measured grayscale brightness curve according to the brightness information;

comparing the measured grayscale brightness curve with a standard grayscale brightness curve to acquire a grayscale compensation value of a preset grayscale;

performing brightness compensation according to the grayscale compensation value.

DETAILED DESCRIPTION

The technical solutions of the embodiments of the present disclosure will be described clearly and thoroughly in conjunction with the accompanying drawings of the embodiments of the present disclosure in order that the objects, technical solutions, and advantages of the embodiments of the present disclosure clearer. Obviously, the described embodiments are some of the embodiments of the present disclosure, rather than all of the embodiments. Based on the described embodiments of the present disclosure, all other embodiments obtained by a person of ordinary skill in the art fall within the protection scope of the present disclosure.

As for the voltage driving mode that has more product applications, the existing compensation mode in the related art can be classified into electrical compensation and optical compensation according to the object of compensation. Electrical compensation can be classified into internal compensation and external compensation. Internal compensation mainly compensates for TFT Vth, while external compensation can compensate more, including TFT Vth, mobility and OLED aging. Of course, these do not represent all electrical parameter differences, let alone differences other than electrical parameters. Therefore, the compensation has certain limitations, and the brightness uniformity after compensation is not good enough; in addition, electrical parameter compensation usually has a compensation range, and if the uniformity of electrical parameters is poor, the uniformity will still be poor after compensation.

Optical compensation directly uses brightness as the object of compensation. After compensation, high uniformity of pixel brightness can be achieved. Therefore, optical compensation is highly expected. However, the existing optical compensation technology uses a CCD camera to collect the brightness of each pixel for compensation. This method requires relatively large equipment, so it is limited to one-time compensation before the product leaves the factory, and cannot compensate for the brightness difference caused by the aging of the product used for a long time.

Figure 1A:
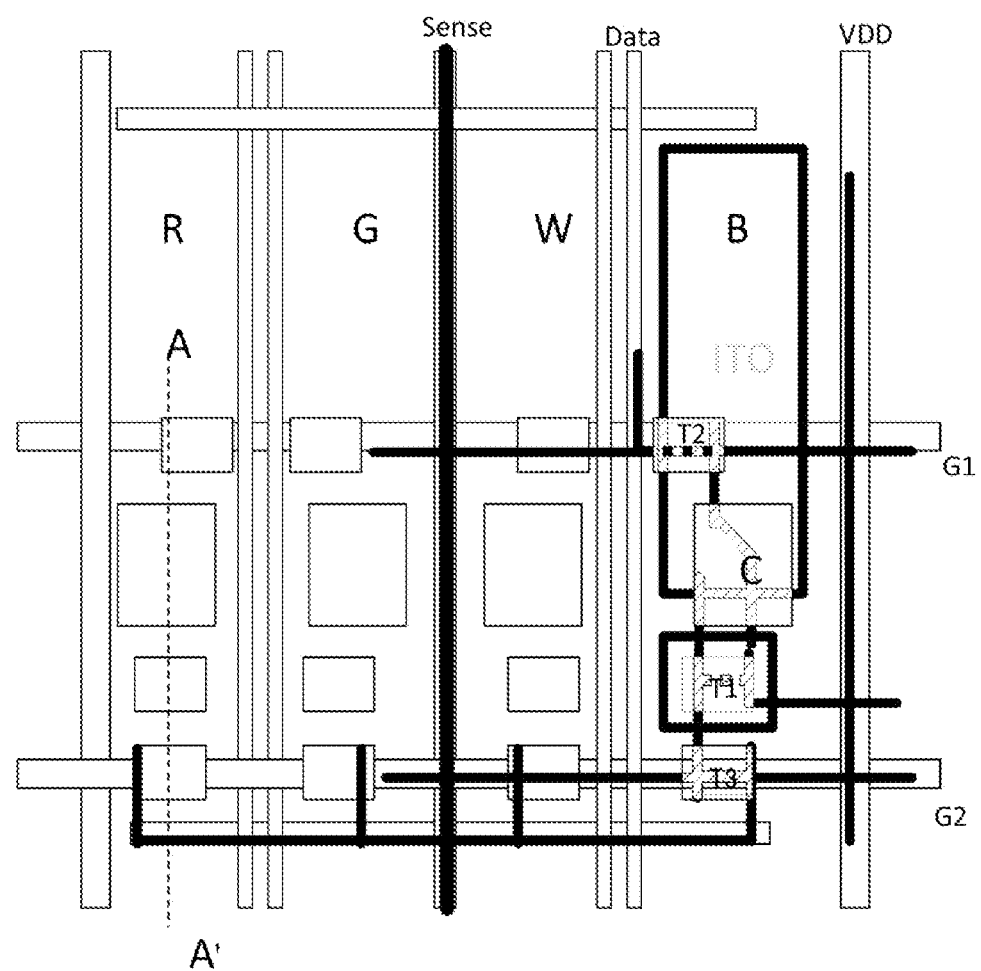
FIG. 1a shows a schematic diagram of a voltage-based external electrical compensation wiring layout in the related art.
Figure 1B:
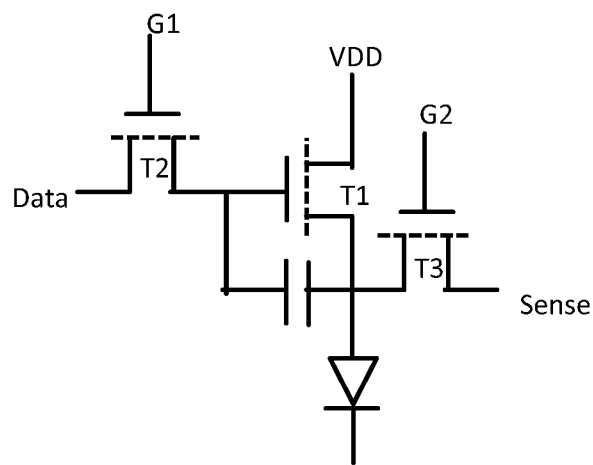
FIG. 1b shows a circuit diagram of a voltage-based external electrical compensation in the related art.

FIGS. 1a and 1b are schematic diagrams of the principle of voltage-based external electrical compensation used at present. FIG. 1a is a schematic diagram of the planar layout of components and wires of the circuit, and FIG. 1b is an equivalent circuit diagram of the circuit layout shown in FIG. 1a. In the layout diagram of the pixel unit shown in FIG. 1a, the regions marked with a letter R, G, B, or W refer to individual sub-pixels. For example, the mark R indicates a red sub-pixel, G indicates a green sub-pixel, B indicates a blue sub-pixel, and W indicates a white sub-pixel. As shown in FIGS. 1a and 1b, take the blue sub-pixel marked with letter B as an example, where the transistor T1 is connected to the light emitting element, the transistor T2 is connected to the data line Data, the transistor T3 is connected to the sensing line Sense, and C is the storage capacitor.

The above sensing line Sense is connected to the 4 sub-pixels sequentially through an inverted T-shaped circuit, and the pixel unit compensation circuit is connected to the sensing line Sense through the transistor T3 in each sub-pixel, thereby realizing the sensing collection of electrical parameters.

Figure 2:
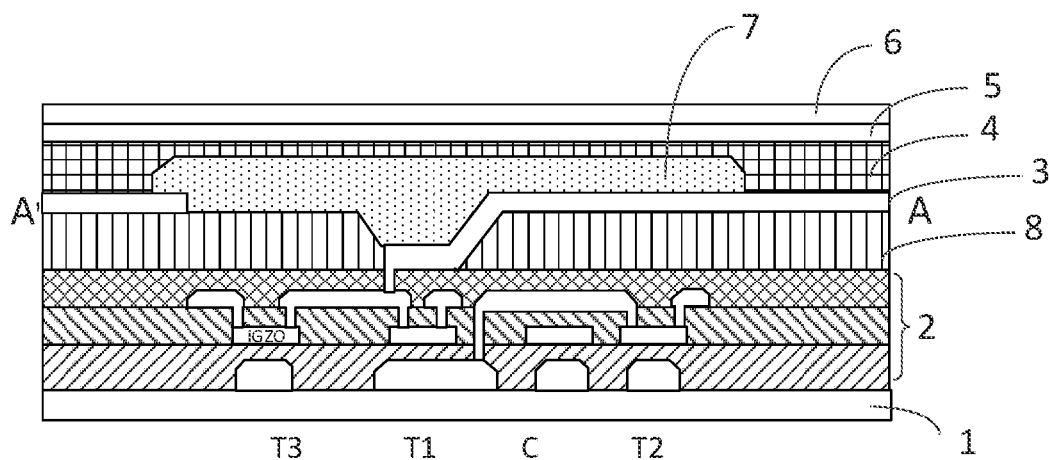
FIG. 2 shows a film layer structure of an OLED display substrate in the related art.

The film layer structure shown in FIG. 2 is a schematic cross-sectional view, taken along the AA' direction, of the film layer structure corresponding to the schematic diagram of the planar layout of components and wires of the circuit shown in FIG. 1a. As shown in FIG. 2, the display substrate includes a base substrate 1, a thin film transistor array layer 2 and a planarization layer 8 located on the base substrate 1, and an anode 3, a pixel definition layer 7, a cathode 5 and a light emitting layer located on the planarization layer 8. The pixel definition layer 7 defines a pixel region, and the light emitting layer 4 is located on a side of the pixel definition layer 7 away from the base substrate.

In the voltage-based external electrical compensation mode, the TFT/OLED current (pixel driving current) of each pixel through the internal sensing circuit and the external sensing IC (driving circuit) is extracted and converted into a digital signal for processing. At the same time, the driving voltage corresponding to the TFT/OLED current is also recorded, so that the I-V curve corresponding to each TFT and OLED can be known. Then, a compensation coefficient is calculated and fed back to a source driver for compensation.

The present disclosure can realize the collection of the brightness of each pixel by replacing the sensing line in FIG. 1a by a light guide, calculate the brightness grayscale curve of each pixel, and then calculate the amount of grayscale that needs to be compensated, thereby realizing the brightness difference compensation of the display. Compared with the structure of the existing OLED device, its structure removes the electrical parameter sensing structure and adds the optical parameter sensing channel. Since the ultimate purpose of the electrical compensation is to correct the difference in brightness, the optical compensation used in the present disclosure is more direct than the electrical compensation, and has the advantages of better compensation effect and simple structure.

Figure 4:
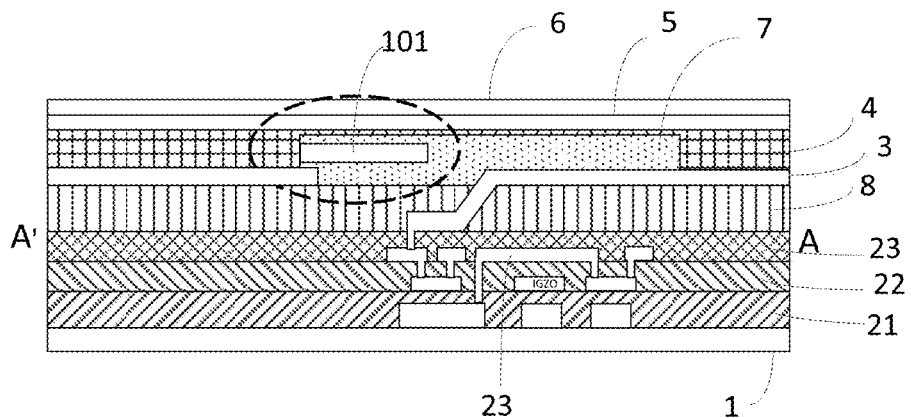
FIG. 4 shows a first schematic diagram of a film layer structure of an OLED display substrate in an embodiment of the present disclosure.

As shown in FIG. 4, the embodiment provides an OLED display substrate which includes a base substrate 1, a thin film transistor array layer 2 and a planarization layer 8 on the base substrate 1, and an anode 3, a pixel definition layer 7, a cathode 5, and a light emitting layer 4 on the planarization layer 8. The pixel definition layer 7 defines pixel regions, the light emitting layer 4 is located on a side of the pixel definition layer 7 away from the base substrate. The display substrate further includes a light guide 101 that is in contact with the light emitting layer 4 and is used to lead out light from the light emitting layer 4. The light guide 101 is used to test the led-out light and adjust light emission.

Figure 3A:
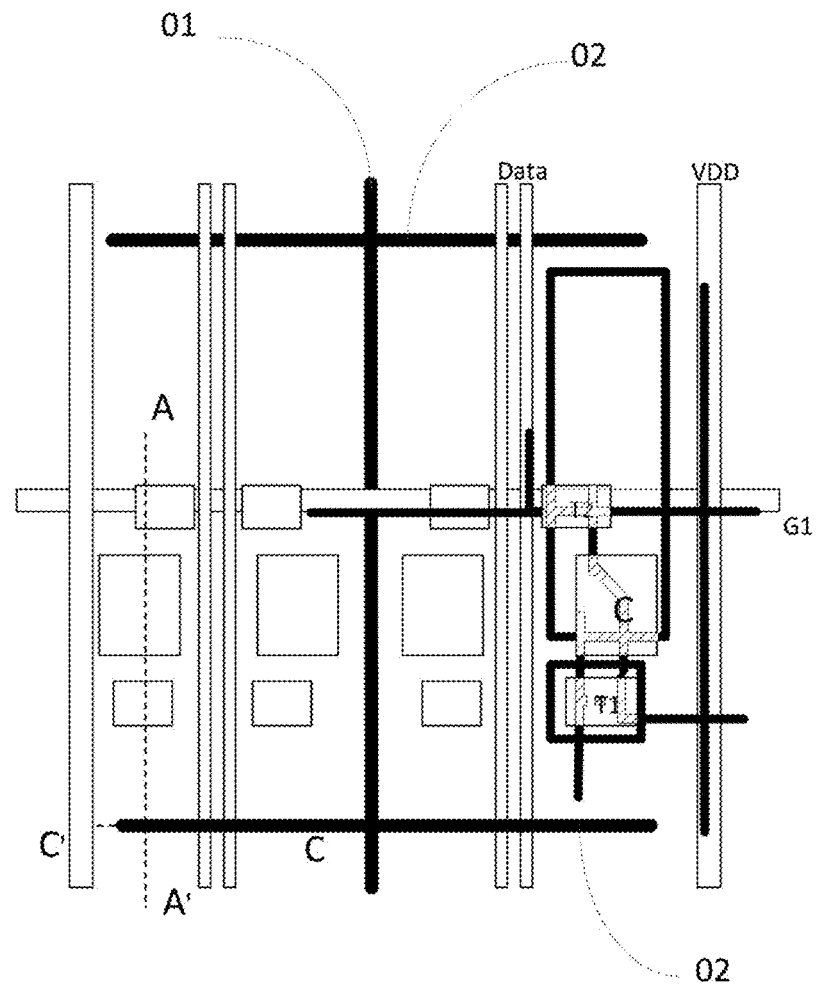
FIG. 3a shows a first schematic diagram of a wiring layout in an embodiment of the present disclosure.
Figure 3B:
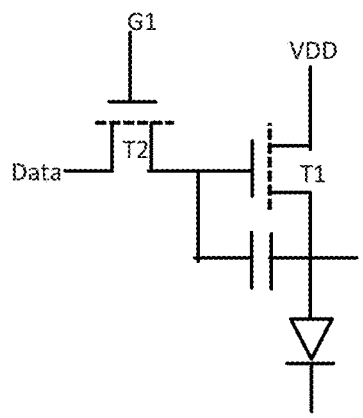
FIG. 3b shows a circuit diagram in an embodiment of the present disclosure.

As shown in FIGS. 3a and 3b, the embodiment replaces the sensing line in FIG. 1 by the light guide 101 in contact with the light emitting layer 4. Referring to FIG. 3a, the light guide 101 includes a row light guide 01 arranged in parallel with the data line and a plurality of column light guides 02 perpendicular to the data line. An end of each column light guide 02 is in contact with the light emitting layer of a plurality of pixel regions to lead out the light from the plurality of pixel regions to the row light guide 01. The row light guide 01 is connected to an external sensor to acquire the brightness of corresponding pixel region to implement the collection of pixel brightness. Compared with FIGS. 1a and 1b, the circuit structure of the OLED display substrate in the embodiment is simplified, the transistor T3, the sense line and other corresponding wires are omitted.

Figure 6A:
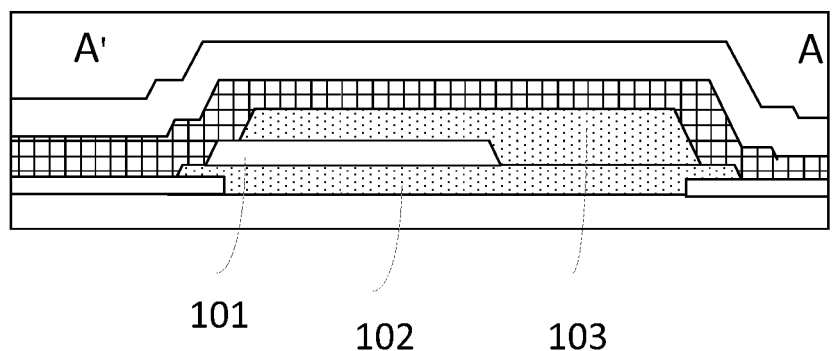
FIG. 6a shows a first schematic diagram of a partial film layer structure of an OLED display substrate in an embodiment of the present disclosure.
Figure 6B:
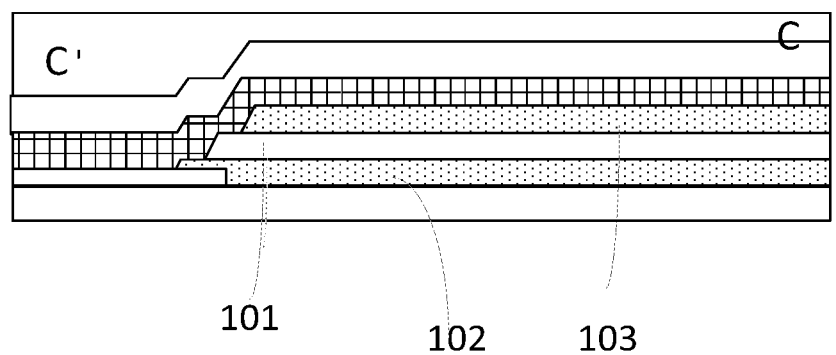
FIG. 6b shows a second schematic diagram of a partial film layer structure of an OLED display substrate in an embodiment of the present disclosure.

The light guide 101 may have various specific structures. For the arrangement of the light guide 101 in an implementation (first implementation) of the embodiment, please refer to FIGS. 4, 6a and 6b. FIG. 4 shows a schematic cross-sectional view, taken along the direction AA' in FIG. 3a, of the film layer structure of the OLED display substrate of the embodiment. As shown in FIGS. 6a and 6b, the pixel definition layer 7 includes a first pixel definition sub-layer 102 and a second pixel definition sub-layer 103 that are stacked, the light guide 101 is located between the first pixel definition sub-layer 102 and the second pixel definition sub-layer 103, and the light guide 101 includes a contact portion exposed outside the pixel definition layer 7 to be in contact with the light emitting layer 4.

In this implementation, a refractive index of the light guide 101 is greater than a refractive index of the pixel definition layer 7.

The larger the refractive index of the light guide 101 relative to the refractive index of the pixel defining layer 7 is, the better, thereby enhancing the total reflection of light in the light guide 101, and thus enabling the light to going out along the light guide 101.

Figure 5:
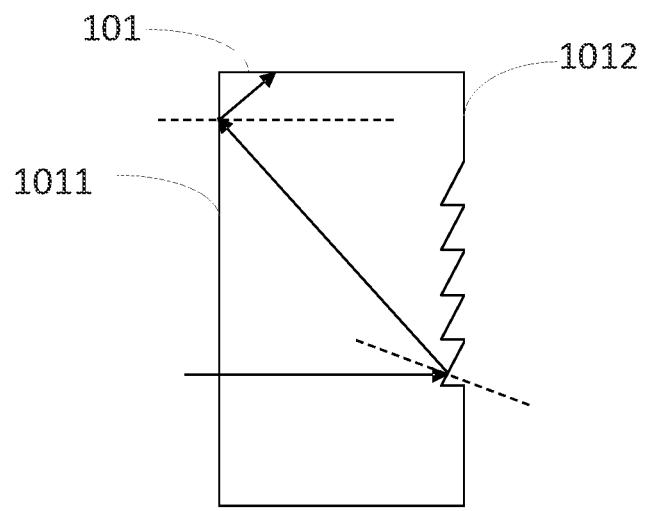
FIG. 5 shows a structural diagram of a light guide in an embodiment of the present disclosure.

In this implementation, the light guide 101 includes a first side 1011 in contact with the light emitting layer 4 and a second side 1012 opposite to the first side 1011, and the contact portion is located on the first side 1011. In order to increase the amount of light led out from the light guide 101, a concave-convex structure is provided on the second side 1012 so that the light entering the light guide is totally reflected on the second side 1012, as shown in FIG. 5.

The arrangement of the concave-convex structure increases the propagation angle of light, allowing more light to be totally reflected at the interface between the light guide 101 and the pixel defining layer 7. Of course, there can be other ways to increase the amount of collected light, which is not limited here.

The concave-convex structure may have various specific structures. In the embodiment, the concave-convex structure is a saw-tooth structure, as shown in FIG. 5, but it is not limited thereto.

A specific manufacturing method of the OLED display substrate in this implementation is as follows:

forming the thin film transistor array layer 2 on the base substrate 1;

forming the planarization layer 8;

forming the anode 3, and performing patterning process;

forming the first pixel definition sub-layer 102 and performing patterning process on it;

forming the light guide 101 on the first pixel definition sub-layer 102 and performing patterning process;

forming the second pixel definition sub-layer 103 and performing patterning process;

wherein the second pixel definition sub-layer 103 should be arranged such that the contact portion of the light guide 101 used to be in contact with the light emitting layer 4 is not covered (that is, the contact portion is not covered by the second pixel definition sub-layer 103), so that the light guide 101 can be in contact with the light emitting layer 4 directly to receive the incoming light; the second side 1012 of the light guide 101 (the side that is opposite to the first side 1011 on which the contact portion is provided) is covered so as to achieve the total reflection of light.

forming the light emitting layer 4 in the pixel regions defined by the pixel definition layer 7 composed of the first pixel definition sub-layer 102 and the second pixel definition sub-layer 103;

forming the cathode layer 5 and an encapsulation layer 6 sequentially.

For the manufacturing of the film layer structure on the OLED display substrate in this implementation, refer to FIGS. 6a and 6b. The light entering the light guide 101 propagates along the C'C direction.

It should be noted that, FIG. 4 simplifies the overall film layer structure, only reflects the up-and-down relationship between layers, and does not describe the specific features of the film layers in detail. FIGS. 6a and 6b show the specific features of partial film layer structure. The following description will also only describe the positional relationship between the film layers, without reflecting specific features.

Figure 7:
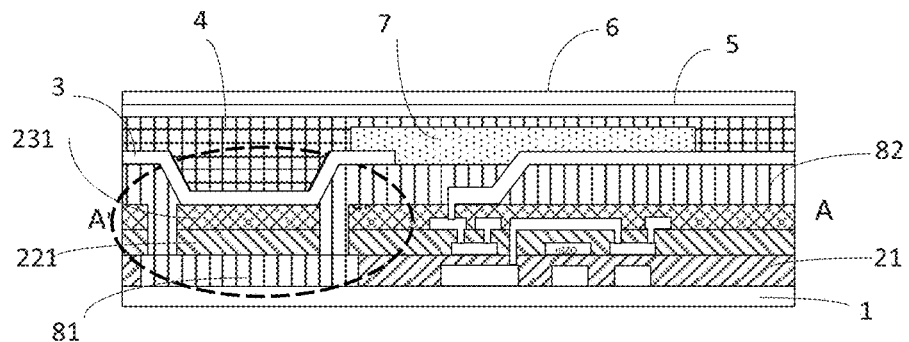
FIG. 7 shows a second schematic diagram of a film layer structure of an OLED display substrate in an embodiment of the present disclosure.

In another implementation (second implementation) of the embodiment, the thin film transistor array layer 2 includes a gate insulation layer 21, a first planarization layer 81, an etching stop layer 22, a passivation layer 23, and a second planarization layer 82 provided on the base substrate 1;

a first opening is provided at a first position of the gate insulation layer 21, the first planarization layer 81 is located in the first opening;

a second opening is provided at a second position of the etching stop layer 22 and the passivation layer 23, the second opening penetrates the etching stop layer 22 and the passivation layer 23, as shown in FIG. 7, a portion of the etching stop layer 22 in the second opening forms a first etching stop sub-layer 221, the second planarization layer 82 is filled between the first etching stop sub-layer 221 and rest of the etching stop layer 22, a portion of the passivation layer 23 in the second opening forms a first passivation sub-layer 231, the second planarization layer 82 is filled between the first passivation sub-layer 231 and rest of the passivation layer 23;

the second planarization layer 82 has a third opening at the second position to expose the first passivation sub-layer 231, so that the first passivation sub-layer 231 leads light out of the light emitting layer 4 (through the anode 3), wherein orthographic projections of the second and third openings on the base substrate fall within an orthographic projection of the first opening on the base substrate.

The first etching stop sub-layer 221 and the first passivation sub-layer 231 jointly form a light guide structure, which functions similarly to the light guide 101 described above with reference to FIG. 4.

Compared with the first implementation, in this implementation, the layout diagram of components and wires of the circuits of the OLED display substrate may be similar to that shown in FIG. 3a, but the specific structure and arrangement position of the light guide 101 have changed. The light guide 101 is arranged on the side of the second planarization layer 82 away from the anode 3, as shown in FIG. 7.

In this implementation, a refractive index of the first etching stop sub-layer 221 is greater than a refractive index of the first planarization layer 81, the refractive index of the first etching stop sub-layer 221 is greater than a refractive index of the second planarization layer 82, a refractive index of the passivation layer 23 is greater than the refractive index of the first planarization layer 81, and the refractive index of the passivation layer 23 is greater than the refractive index of the second planarization layer 82.

With the above solution, the light from the light emitting layer 4 enters the first passivation sub-layer 231 and the first etching stop sub-layer 221, and is totally reflected at the interface between the first passivation sub-layer 231 and the second planarization layer 82, and is totally reflected at the interface between the first etching stop sub-layer 221 and the first planarization layer 81, so that light propagates in the light guide formed by the first passivation sub-layer 231 and the first etching stop sub-layer 221, and is led out.

Figure 8:
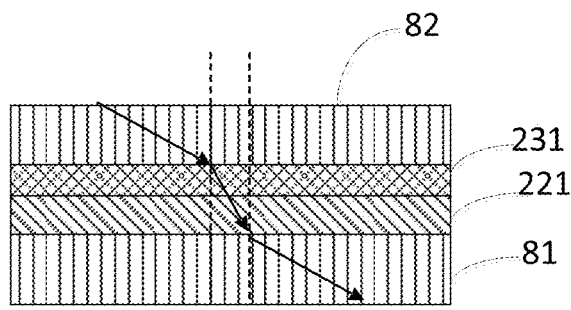
FIG. 8 shows a schematic diagram of a partial film layer structure in which no third opening is provided in a planarization layer.

The manufacturing method of the OLED display substrate in this implementation is as follows:

forming a gate layer and a gate insulation layer on the base substrate 1;
etching away the gate insulation layer at a position (the first position) of the orthographic projection of the light guide 101 on the gate insulation layer in the planar layout shown in FIG. 3a, to form the first opening, and then forming a first planarization layer 81 on the first opening;
forming an IGZO (indium gallium zinc oxide) film layer, an etching stop layer 22, a source, a drain, and a passivation layer 23 sequentially;
etching the passivation layer 23 and the etching stop layer 22 to form the second opening penetrating the passivation layer 23 and the etching stop layer 22 (the passivation layer 23 and the etching stop layer 22 located in the second opening are named the first passivation sub-layer 231 and the first etching stop sub-layer 221, respectively);
forming a second planarization layer 82, wherein a part of the second planarization layer 82 is filled in the second opening and in contact with the first planarization layer 81, so as to cover the first passivation sub-layer 231 and the first etching stop sub-layer 221;
etching the second planarization layer 82 to form a third opening that exposes the first passivation sub-layer 231;
the third opening is arranged to make the light emitting layer 4 be in contact with the first passivation sub-layer 231 after the light emitting layer 4 is formed, so that light can propagate in a total reflection manner in the light guide 101 composed of the first passivation sub-layer 231 and the first etching stop sub-layer 221. If the third opening is not formed, the first passivation sub-layer 231 cannot contact the light emitting layer 4, that is, the light guide 101 cannot contact the light emitting layer 4; thus, no matter what angle the light enters the light guide 101, it will exit at the same angle, and the light cannot propagate in the light guide 101, as shown in FIG. 8.

It should be noted that the anode 3 is made of a transparent conductive material, such as ITO (Indium Tin Oxide) or IZO (Indium Zinc Oxide), which does not affect the light from the light emitting layer 4 entering the first passivation sub-layer 231.

Figure 9:
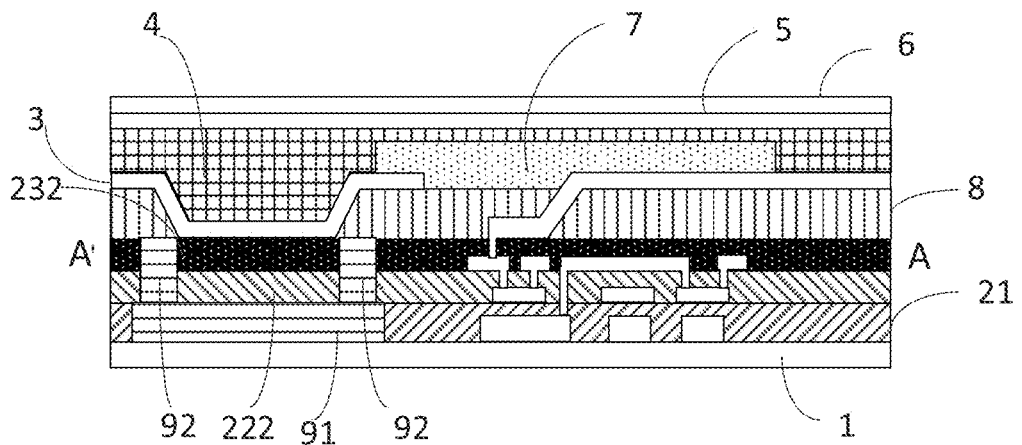
FIG. 9 shows a third schematic diagram of a film layer structure of an OLED display substrate in an embodiment of the present disclosure.

In another implementation (third implementation) of the embodiment, a layout diagram of components and wires of the circuit of the OLED display substrate is shown in FIG. 3a, and a schematic diagram of the film layer structure of the OLED display substrate is shown in FIG. 9. The thin film transistor array layer 2 includes a gate insulation layer 21, a gate, a first metal film layer 91, an etching stop layer 22, a passivation layer 23, a second metal film layer 92 and a planarization layer 8 provided on the base substrate 1;

the first metal film layer 91 and the gate are manufactured in a same layer and formed at a first position;
a fourth opening is provided at a second position of the etching stop layer 22 and the passivation layer 23, the fourth opening penetrates the etching stop layer 22 and the passivation layer 23, as shown in FIG. 9, a portion of the etching stop layer 22 in the fourth opening forms a second etching stop sub-layer 222, the second metal film layer 92 is filled between the second etching stop sub-layer 222 and rest of the etching stop layer 22, a portion of the passivation layer 23 in the fourth opening forms a second passivation sub-layer 232, the second metal film layer 92 is filled between the second passivation sub-layer 232 and rest of the passivation layer 23;
the planarization layer 8 has a fifth opening at the second position to expose the second passivation sub-layer 232 so that the second passivation sub-layer 232 leads light out of the light emitting layer 4 (through the anode), wherein orthographic projections of the fourth and fifth openings on the base substrate fall within the orthographic projection of the first opening on the base substrate;
the second etching stop sub-layer 222 and the second passivation sub-layer 232 jointly form a light guide structure, which functions similarly to the light guide 101 described above with reference to FIG. 4.

With the above technical solution, since the cathode 5 is above the light emitting layer 4, the light emitted by the light emitting layer 4 is confined to propagate inside the light guide 101 (the second passivation sub-layer 232 and The second etching stop sub-layer 222) due to the light reflection on the metal. Compared with the second implementation, the amount of light led out from the light guide 101 in this implementation is greatly increased.

In this implementation, the first metal film layer 91 may be made in the same layer as the gate layer, and the pattern for forming the fourth opening may be formed at the same time as the pattern for forming vias of the source and drain. The second metal film layer 92 is made in the same layer as the source and the drain. Of course, the OLED display substrate in this implementation may also be manufactured by other manufacturing methods.

A specific manufacturing method of the OLED display substrate in this implementation is as follows:

- forming the gate and the first metal film layer 91 on the base substrate 1;
- forming the gate insulation layer 21 and the etching stop layer 22;
- performing patterning process on the etching stop layer 22 to form the vias corresponding to the source and drain and the fourth opening;
- forming the second metal film layer 92 and the source and drain;
- forming the passivation layer 23;
- forming the planarization layer 8, and performing patterning process to form the fifth opening;
- forming the anode 3, the pixel definition layer 7, the cathode 5, and the light emitting layer 4 located in the pixel region defined by the pixel definition layer 7.

Figure 10A:
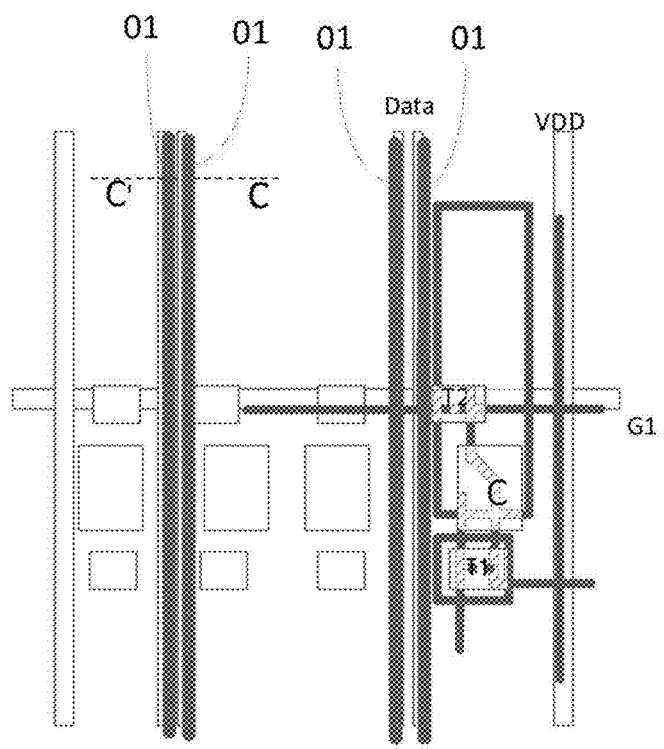
FIG. 10a shows a second schematic diagram of a wiring layout in an embodiment of the present disclosure.
Figure 11A:
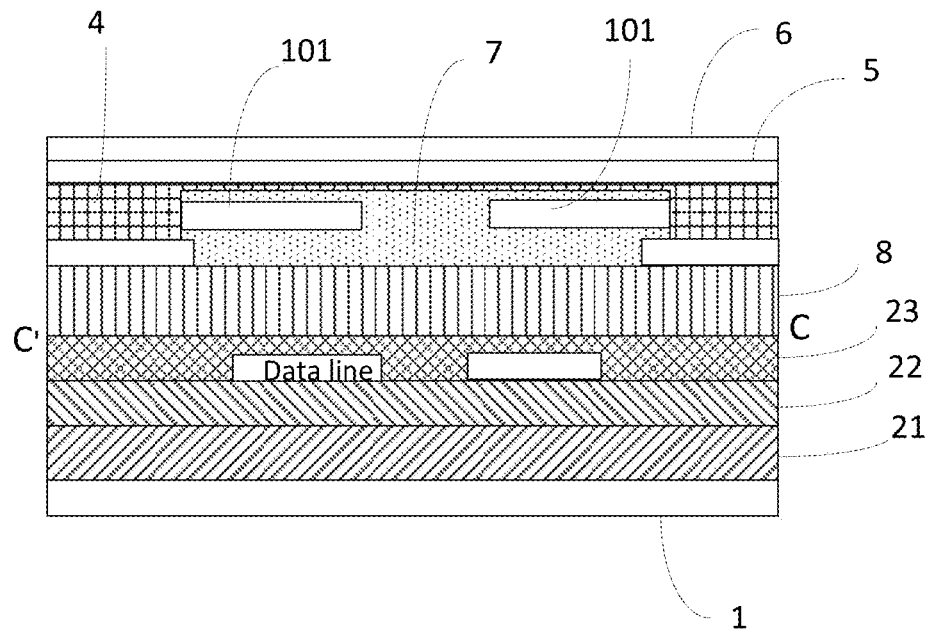
FIG. 11a shows a fourth schematic diagram of a film layer structure of an OLED display substrate in an embodiment of the present disclosure.

In another implementation (fourth implementation) of the embodiment, a layout of components and wires of the circuit of the OLED display substrate in the embodiment is shown in FIG. 10*a*, and a schematic diagram of the film layer structure of the OLED display substrate corresponding to FIG. 10*a* is shown in FIG. 11*a*. The light guide 101 includes a plurality of row light guides 01 arranged in parallel with data lines, the number of the row light guides 01 is equal to the number of rows of the pixel regions, and each row of the pixel regions is connected to one corresponding row light guide 01, and the light propagates along a straight line. Compared with the layout in FIG. 3*a*, the change of the light propagation angle caused by the turning of the light is reduced, thereby reducing the phenomenon of reduction of the total reflected light.

In this implementation, the pixel definition layer 7 includes a first pixel definition sub-layer 102 and a second pixel definition sub-layer 103 that are stacked. The light guide 101 is located between the first pixel definition sub-layer 102 and the second pixel definition sub-layer 103, and the light guide 101 includes a contact portion exposed outside the pixel definition layer 7 to be in contact with the light emitting layer 4.

In this implementation, the refractive index of the light guide 101 is greater than the refractive index of the pixel definition layer 7.

The larger the refractive index of the light guide 101 relative to the refractive index of the pixel defining layer 7 is, the better, thereby enhancing the total reflection of light in the light guide 101, and thus enabling the light to going out along the light guide 101.

In this implementation, the light guide 101 includes a first side 1011 in contact with the light emitting layer 4 and a second side 1012 opposite to the first side 1011, and the contact portion is located on the first side 1011. In order to increase the amount of light led out from the light guide 101, a concave-convex structure is provided on the second side 1012 so that the light entering the light guide is totally reflected on the second side 1012.

The arrangement of the concave-convex structure increases the propagation angle of light, allowing more light to be totally reflected at the interface between the light guide 101 and the pixel defining layer 7. Of course, there can be other ways to increase the amount of collected light, which is not limited here.

A specific manufacturing method of the OLED display substrate in this implementation is as follows:

- forming the thin film transistor array layer 2 on the base substrate 1;
- forming the planarization layer 8;
- forming the anode 3, and performing patterning process;
- forming the first pixel definition sub-layer 102 and performing patterning process on it;
- forming the light guide 101 on the first pixel definition sub-layer 102 and performing patterning process;
- forming the second pixel definition sub-layer 103 and performing patterning process;
- wherein the second pixel definition sub-layer 103 should be arranged such that the contact portion of the light guide 101 used to be in contact with the light emitting layer 4 is not covered (that is, the contact portion is not covered by the second pixel definition sub-layer 103), so that the light guide 101 can be in contact with the light emitting layer 4 directly to receive the incoming light; the second side 1012 of the light guide 101 (the side that is opposite to the first side 1011 on which the contact portion is provided) is covered so as to achieve the total reflection of light.
- forming the light emitting layer 4 in the pixel regions defined by the pixel definition layer 7 composed of the first pixel definition sub-layer 102 and the second pixel definition sub-layer 103;
- forming the cathode layer 5 and an encapsulation layer 6 sequentially.

Figure 10B:
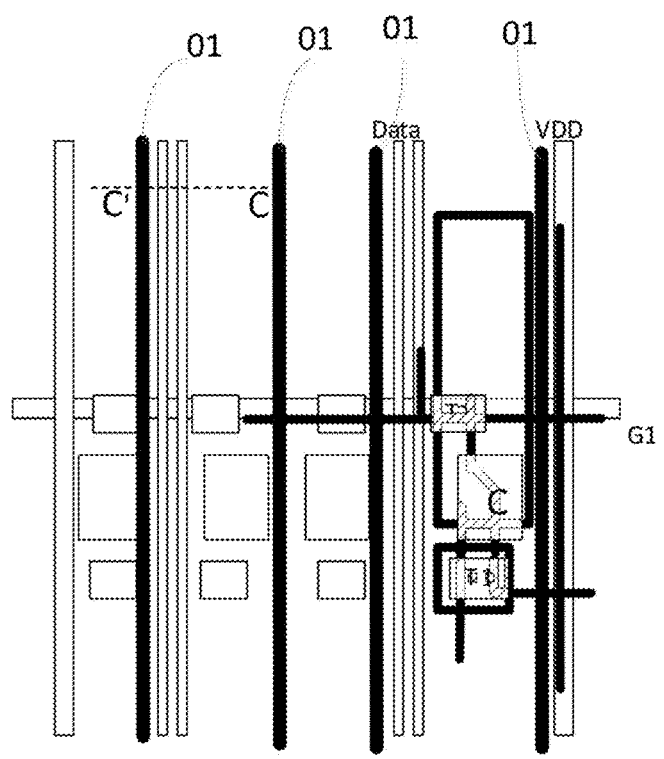
FIG. 10b shows a third schematic diagram of a wiring layout in an embodiment of the present disclosure.
Figure 11B:
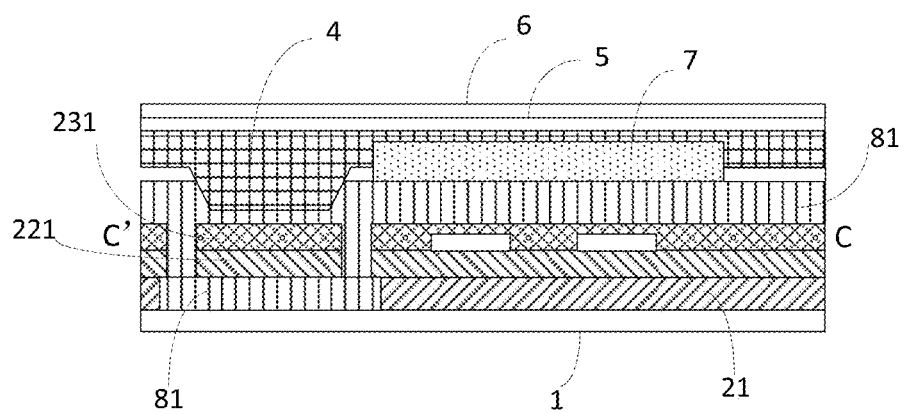
FIG. 11b shows a fifth schematic diagram of a film layer structure of an OLED display substrate in an embodiment of the present disclosure.

In another implementation (fifth implementation) of the embodiment, a layout of components and wires of the circuit of the OLED display substrate in the embodiment is shown in FIG. 10*b*, and a schematic diagram of the film layer structure of the OLED display substrate corresponding to FIG. 10*b* is shown in FIG. 11*b*. The light guide 101 includes a plurality of row light guides 01 arranged in parallel with data lines, the number of the row light guides 01 is equal to the number of rows of the pixel regions, and each row of the pixel regions is connected to one corresponding row light guide 01, and the light propagates along a straight line. Compared with the layout in FIG. 3*a*, since the light propagates along a straight line, the change of the light propagation angle caused by the turning of the light is reduced, thereby reducing the phenomenon of reduction of the total reflected light.

In this implementation, the thin film transistor array layer 2 includes a gate insulation layer 21, a first planarization layer 81, an etching stop layer 22, a pas sivation layer 23, and a second planarization layer 82 provided on the base substrate 1;

- a first opening is provided at a first position of the gate insulation layer 21, the first planarization layer 81 is located in the first opening;
- a second opening is provided at a second position of the etching stop layer 22 and the passivation layer 23, the second opening penetrates the etching stop layer 22 and the passivation layer 23, as shown in FIG. 7, a portion of the etching stop layer 22 in the second opening forms a first etching stop sub-layer 221, the second planarization layer 82 is filled between the first etching stop sub-layer 221 and rest of the etching stop layer 22, a portion of the passivation layer 23 in the second opening forms a first passivation sub-layer 231, the second planarization layer 82 is filled between the first passivation sub-layer 231 and rest of the passivation layer 23;

the second planarization layer 82 has a third opening at the second position to expose the first passivation sub-layer 231, so that the first passivation sub-layer 231 leads light out of the light emitting layer 4 (through the anode 3), wherein orthographic projections of the second and third openings on the base substrate fall within an orthographic projection of the first opening on the base substrate.

The first etching stop sub-layer 221 and the first passivation sub-layer 231 jointly form a light guide structure, which functions similarly to the light guide 101 described above with reference to FIG. 4.

In this implementation, the refractive index of the etching stop layer 22 is greater than the refractive index of the first planarization layer 81, the refractive index of the etching stop layer 22 is greater than the refractive index of the second planarization layer 82, the refractive index of the passivation layer 23 is greater than the refractive index of the first planarization layer 81, and the refractive index of the passivation layer 23 is greater than the refractive index of the second planarization layer 82.

With the above solution, the light from the light emitting layer 4 enters the first passivation sub-layer 231 and the first etching stop sub-layer 221, and is totally reflected at the interface between the first passivation sub-layer 231 and the second planarization layer 82, and is totally reflected at the interface between the first etching stop sub-layer 221 and the first planarization layer 81, so that the light propagates in the light guide 101 formed by the first passivation sub-layer 231 and the first etching stop sub-layer 221, and is led out.

The manufacturing method of the OLED display substrate in this implementation is as follows:

forming a gate layer and a gate insulation layer on the base substrate 1;

etching away the gate insulation layer at a position (the first position) of the orthographic projection of the light guide 101 on the gate insulation layer in the planar layout shown in FIG. 11b, to form the first opening, and then forming a first planarization layer 81 on the first opening;

forming an IGZO (indium gallium zinc oxide) film layer, an etching stop layer 22, a source, a drain, and a passivation layer 23 sequentially;

etching the passivation layer 23 and the etching stop layer 22 to form the second opening penetrating the passivation layer 23 and the etching stop layer 22 (the passivation layer 23 and the etching stop layer 22 located in the second opening are named the first passivation sub-layer 231 and the first etching stop sub-layer 221, respectively);

forming a second planarization layer 82, wherein a part of the second planarization layer 82 is filled in the second opening and in contact with the first planarization layer 81, so as to cover the first passivation sub-layer 231 and the first etching stop sub-layer 221;

etching the second planarization layer 82 to form a third opening that exposes the first passivation sub-layer 231;

the third opening is arranged to make the light emitting layer 4 be in contact with the first passivation sub-layer 231 after the light emitting layer 4 is formed, so that light can propagate in a total reflection manner in the light guide 101 composed of the first passivation sub-layer 231 and the first etching stop sub-layer 221.

It should be noted that the anode 3 is made of a transparent conductive material, which does not affect the light from the light emitting layer 4 entering the first passivation sub-layer 231.

In another implementation (sixth implementation) of the embodiment, a layout of components and wires of the circuit of the OLED display substrate in the embodiment is shown in FIG. 10b, and a schematic diagram of the film layer structure of the OLED display substrate corresponding to FIG. 10b is shown in FIG. 11b. The light guide 101 includes a plurality of row light guides 01 arranged in parallel with data lines, the number of the row light guides 01 is equal to the number of rows of the pixel regions, that is to say, each row of the pixel regions is connected to one corresponding row light guide 01, and the light propagates along a straight line. Compared with the layout in FIG. 3a, since the light propagates along a straight line, the change of the light propagation angle caused by the turning of the light is reduced, thereby reducing the phenomenon of reduction of the total reflected light.

The thin film transistor array layer 2 includes a gate insulation layer 21, a gate, a first metal film layer 91, an etching stop layer 22, a passivation layer 23, a second metal film layer 92, and a planarization 8 provided on the base substrate 1;

the first metal film layer 91 and the gate are manufactured in a same layer;

a fourth opening penetrating the etching stop layer 22 is provided on the passivation layer 23 to form a second etching stop sub-layer 222 and a second passivation sub-layer 232, the second metal film layer 92 is located in the fourth opening and makes contact with the first metal film layer 91 to cover the second passivation sub-layer 232 and the second etching stop sub-layer 222;

the planarization layer 8 has a fifth opening to expose the second passivation sub-layer 232;

the second etching stop sub-layer 222 and the second passivation sub-layer 232 constitutes the light guide 101.

With the above technical solution, since the cathode 5 is above the light emitting layer 4, all the light emitted by the light emitting layer 4 is confined to propagate inside the light guide 101 (the second passivation sub-layer 232 and The second etching stop sub-layer 222) due to the light reflection on the metal. Compared with the fifth implementation, the amount of light led out from the light guide 101 in this implementation is greatly increased.

In this implementation, the first metal film layer 91 may be made in the same layer as the gate layer, and the pattern for forming the fourth opening may be formed at the same time as the pattern for forming vias of the source and drain. The second metal film layer 92 is made in the same layer as the source and the drain. Of course, the OLED display substrate in this implementation may also be manufactured by other manufacturing methods.

A specific manufacturing method of the OLED display substrate in this implementation is as follows:

forming the gate and the first metal film layer 91 on the base substrate 1;

forming the gate insulation layer 21, the etching stop layer 22, and the passivation layer 23;

performing patterning process on the etching stop layer 22 and the passivation layer 23 to form the vias corresponding to the source and drain and the fourth opening;

forming the second metal film layer 92 and the source and drain;

forming the planarization layer 8, and performing patterning process to form the fifth opening;

forming the anode 3, the pixel definition layer 7, the cathode 5, and the light emitting layer 4 located in the pixel region defined by the pixel definition layer 7.

The embodiment further provides an OLED display device including the above OLED display substrate and a brightness compensation mechanism which is connected to the light guide 101 to collect brightness information of the light emitting layer 4 and compensates brightness of a corresponding pixel region according to the brightness information.

By replacing the sensing line in FIG. 1a by the light guide 101, the collection of the brightness of each pixel can be realized, thereby calculating the brightness grayscale curve of each pixel, then calculating the amount of grayscale that needs to be compensated, and thus realizing the brightness difference compensation of the display. Compared with the structure of the existing OLED device, its structure removes the electrical parameter sensing structure and adds the optical parameter sensing channel. Since the ultimate purpose of the electrical compensation is to correct the difference in brightness, the optical compensation used in the OLED display device in the present embodiment is more direct than the electrical compensation, and has the advantages of better compensation effect and simple structure.

In the embodiment, the brightness compensation mechanism includes:

a brightness information collection module configured to collect the brightness information of the light emitting layer 4 in each pixel region, the brightness information including brightness corresponding to a plurality of grayscales in one-to-one manner;

a grayscale brightness curve acquisition module configured to acquire a measured grayscale brightness curve of each pixel region according to the brightness information;

a grayscale compensation value acquisition module configured to compare the measured grayscale brightness curve with a standard grayscale brightness curve to acquire a grayscale compensation value of a preset grayscale;

a compensation module configured to perform brightness compensation according to the grayscale compensation value.

In the embodiment, a brightness correction module is further provided, which includes:

a standard photoelectric sensor connected to the light guide 101 to acquire a measured brightness L1 of the light emitting layer 4 in a current pixel region;

an image sensor configured to acquire an actual brightness L2 of the current pixel region;

a brightness correction coefficient acquisition unit configured to acquire a brightness correction coefficient A=L2/L1 according to the measured brightness L1 and the actual brightness L2;

the brightness information acquired by the brightness information collection module is a product of a first brightness acquired through the light guide 101 and the brightness correction coefficient.

The parameters of individual sensors are different to a certain extent, and the luminous brightness of any position in each pixel region are also different to a certain extent. The present of the brightness correction module reduces the difference in the brightness information collection caused by the difference in sensor parameters, and improves the accuracy of brightness collection.

The embodiment further provides a brightness compensation method applied to the above OLED display device, which includes steps of:

collecting the brightness information of the light emitting layer 4 in each pixel region, specifically, selecting a pixel region in the i-th row and the j-th column to make it emit light, and performing brightness collection through a photoelectric sensor connected to the light guide 101;

acquiring a measured grayscale brightness curve of each pixel region according to the brightness information, specifically, selecting K different grayscales from all grayscales for measurement, and lighting the K grayscales separately; here, lighting the individual pixel regions one by one; measuring the brightness information of each pixel region, from which the grayscale brightness curve of each pixel region can be obtained by fitting;

comparing the measured grayscale brightness curve with a standard grayscale brightness curve to acquire a grayscale compensation value of a preset grayscale, specifically, comparing the measured grayscale brightness curve with a standard grayscale brightness curve to calculate the brightness corresponding to a grayscale G in the standard grayscale brightness curve and an actual grayscale value G' in the measured grayscale brightness curve, and obtaining $\Delta=G'-G$ as the grayscale compensation value of a target brightness;

performing brightness compensation according to the grayscale compensation value, specifically, calculating a compensated grayscale according to the grayscale compensation value and a displayed grayscale provided by a signal generator, and outputting the same to a row-and-column selection control unit to control a display screen to display.

The above are the preferred embodiments of the present disclosure. It should be noted that for those of ordinary skill in the art, without departing from the principles described in the present disclosure, several improvements and modifications can be made. These improvements and modifications should also be regarded as the protection scope of this disclosure.

The invention claimed is:

1. An OLED display substrate, comprising a base substrate, a thin film transistor array layer and a planarization layer on the base substrate, and an anode, a pixel definition layer, a cathode, and a light emitting layer on a side of the planarization layer away from the base substrate, the pixel definition layer defining pixel regions, the light emitting layer being located on a side of the pixel definition layer away from the base substrate, the display substrate further comprising a light guide that is in contact with the light emitting layer and is used to lead out light from the light emitting layer, so as to test the led-out light and adjust light emission;

wherein the thin film transistor array layer comprises a gate insulation layer, a first planarization layer, an etching stop layer, a passivation layer, and a second planarization layer provided on the base substrate;

a first opening is provided at a first position of the gate insulation layer, and the first planarization layer is located in the first opening;

a second opening is provided at a second position of the etching stop layer and the passivation layer, the second opening penetrates the etching stop layer and the passivation layer, a portion of the etching stop layer in the second opening forms a first etching stop sub-layer, the second planarization layer is filled between the first etching stop sub-layer and rest of the etching stop layer, a portion of the passivation layer in the second opening forms a first passivation sub-layer, the second planarization layer is filled between the first passivation sub-layer and rest of the passivation layer;

the second planarization layer has a third opening at the second position to expose the first passivation sub-layer, the first etching stop sub-layer and the first passivation sub-layer constitutes the light guide, wherein the light guide further comprises an anode which is provided between the first passivation sub-layer and the light emitting layer, wherein orthographic projections of the second and third openings on the base substrate fall within an orthographic projection of the first opening on the base substrate.

2. The OLED display substrate according to claim 1, wherein the pixel definition layer comprises a first pixel definition sub-layer and a second pixel definition sub-layer stacked in a direction away from the base substrate, the light guide is located between the first pixel definition sub-layer and the second pixel definition sub-layer, and the light guide comprises a contact portion exposed outside the pixel definition layer to be in contact with the light emitting layer.

3. The OLED display substrate according to claim 2, wherein a refractive index of the light guide is greater than a refractive index of the pixel definition layer.

4. The OLED display substrate according to claim 2, wherein the light guide comprises a first side in contact with the light emitting layer and a second side opposite to the first side, the contact portion is located on the first side, and a concave-convex structure is provided on the second side so that light entering the light guide is totally reflected on the second side.

5. The OLED display substrate according to claim 2, wherein the light guide comprises a plurality of row light guides arranged in parallel with data lines, a number of the row light guides is equal to a number of rows of the pixel regions, and each row of the pixel regions is connected to one corresponding row light guide.

6. The OLED display substrate according to claim 5, wherein the light guide further comprises at least one column light guide, and the at least one column light guide intersects the row light guides.

7. The OLED display substrate according to claim 1, wherein a refractive index of the etching stop layer is greater than a refractive index of the first planarization layer, the refractive index of the etching stop layer is greater than a refractive index of the second planarization layer, a refractive index of the passivation layer is greater than the refractive index of the first planarization layer, and the refractive index of the passivation layer is greater than the refractive index of the second planarization layer.

8. The OLED display substrate according to claim 1, wherein the thin film transistor array layer comprises a gate insulation layer, a gate, a first metal film layer, an etching stop layer, a passivation layer, a second metal film layer, and a planarization layer provided on the base substrate;

the first metal film layer and the gate are manufactured in a same layer and formed at a first position;

a fourth opening is provided at a second position of the etching stop layer and the passivation layer, the fourth opening penetrates the etching stop layer and the passivation layer, a portion of the etching stop layer in the fourth opening forms a second etching stop sub-layer, the second metal film layer is filled between the second etching stop sub-layer and rest of the etching stop layer, a portion of the passivation layer in the fourth opening forms a second passivation sub-layer, the second metal film layer is filled between the second passivation sub-layer and rest of the passivation layer;

the planarization layer has a fifth opening at the second position to expose the second passivation sub-layer;

the second etching stop sub-layer and the second passivation sub-layer constitutes the light guide, wherein an orthographic projection of the fifth opening on the base substrate falls within an orthographic projection of the fourth opening on the base substrate.

9. An OLED display device, comprising the OLED display substrate according to claim 1, and a brightness compensation mechanism which is connected to the light guide to collect brightness information of the light emitting layer and compensates brightness of a corresponding pixel region according to the brightness information.

10. The OLED display device according to claim 9, wherein the brightness compensation mechanism comprises:

a brightness information collection module configured to collect the brightness information of the light emitting layer in each pixel region, the brightness information comprising brightness corresponding to a plurality of grayscales in one-to-one manner;

a grayscale brightness curve acquisition module configured to acquire a measured grayscale brightness curve according to the brightness information;

a grayscale compensation value acquisition module configured to compare the measured grayscale brightness curve with a standard grayscale brightness curve to acquire a grayscale compensation value of a preset grayscale;

a compensation module configured to perform brightness compensation according to the grayscale compensation value.

11. The OLED display device according to claim 10, further comprising a brightness correction module which comprises:

a standard photoelectric sensor connected to the light guide to acquire a measured brightness L1 of the light emitting layer in a current pixel region;

an image sensor configured to acquire an actual brightness L2 of the current pixel region;

a brightness correction coefficient acquisition unit configured to acquire a brightness correction coefficient $A=L2/L1$ according to the measured brightness L1 and the actual brightness L2;

the brightness information acquired by the brightness information collection module is a product of a first brightness acquired through the light guide and the brightness correction coefficient.

12. The OLED display device according to claim 9, wherein the pixel definition layer comprises a first pixel definition sub-layer and a second pixel definition sub-layer stacked in a direction away from the base substrate, the light guide is located between the first pixel definition sub-layer and the second pixel definition sub-layer, and the light guide comprises a contact portion exposed outside the pixel definition layer to be in contact with the light emitting layer.

13. The OLED display device according to claim 12, wherein a refractive index of the light guide is greater than a refractive index of the pixel definition layer.

14. The OLED display device according to claim 12, wherein the light guide comprises a first side in contact with the light emitting layer and a second side opposite to the first side, the contact portion is located on the first side, and a concave-convex structure is provided on the second side so that light entering the light guide is totally reflected on the second side.

15. A manufacturing method of OLED display substrate, comprising:
    forming a thin film transistor array layer on a base substrate;
    forming a planarization layer;
    forming an anode and a pixel definition layer on a side of the planarization away from the base substrate;
    forming a light emitting layer on a side of the pixel definition layer away from the base substrate;
    forming a light guide, the light guide being in contact with the light emitting layer and used to lead out light from the light emitting layer to test the led-out light and adjust light emission; and
    forming a cathode on the light emitting layer;
    wherein the light guide is composed of a passivation layer and an etching stop layer, and the method comprises:
        forming a gate layer and a gate insulation layer on the base substrate;
        etching the gate insulation layer at a first position to form a first opening;
        forming a first planarization layer in the first opening;
        forming the etching stop layer and the passivation layer;
        etching the passivation layer and the etching stop layer to form a second opening penetrating the passivation layer and the etching stop layer, a portion of the etching stop layer in the second opening forming a first etching stop sub-layer, a portion of the passivation layer in the second opening forming a first passivation sub-layer;
        forming a second planarization layer, wherein a part of the second planarization layer filled in the second opening and the first passivation layer are in contact with each other, so as to cover the first passivation sub-layer and the first etching stop sub-layer; and
        etching the second planarization layer at a second position to form a third opening exposing the first passivation sub-layer.

16. The manufacturing method according to claim 15, wherein the pixel definition layer comprises a first pixel definition sub-layer and a second pixel definition sub-layer, and after the step of forming the planarization layer, the method comprises:
    forming the anode and performing patterning process;
    forming the first pixel definition sub-layer and performing patterning process;
    forming the light guide on the first pixel definition sub-layer and performing patterning process;
    forming the second pixel definition sub-layer on the first pixel definition sub-layer and the light guide, and performing patterning process;
    forming the light emitting layer on the second pixel definition sub-layer; and
    forming the cathode on the light emitting layer.

17. The manufacturing method according to claim 15, wherein the light guide is composed of a passivation layer and an etching stop layer, and the method comprises:
    forming a gate and a first metal film layer in a same layer on the base substrate, wherein the first metal film layer is formed at a first position;
    forming a gate insulation layer, a passivation layer and an etching stop layer;
    performing patterning process on the passivation layer and the etching stop layer to form a fourth opening, a portion of the etching stop layer in the fourth opening forming a second etching stop sub-layer, a portion of the passivation layer in the fourth opening forming a second passivation sub-layer;
    forming a second metal film layer in the fourth opening, the second metal film layer being filled between the second etching stop sub-layer and rest of the etching stop layer and filled between the second passivation sub-layer and rest of the passivation layer;
    forming the planarization and performing patterning process to form a fifth opening;
    forming the node, the pixel definition layer, the cathode, and the light emitting layer in pixel regions defined by the pixel definition layer.

18. A brightness compensation method, applied to an OLED display device, the OLED display device comprising an OLED display substrate, and a brightness compensation mechanism which is connected to the light guide to collect brightness information of the light emitting layer and compensates brightness of a corresponding pixel region according to the brightness information;
    wherein the OLED display substrate comprises a base substrate, a thin film transistor array layer and a planarization layer on the base substrate, and an anode, a pixel definition layer, a cathode, and a light emitting layer on a side of the planarization layer away from the base substrate, the pixel definition layer defining pixel regions, the light emitting layer being located on a side of the pixel definition layer away from the base substrate, the display substrate further comprising a light guide that is in contact with the light emitting layer and is used to lead out light from the light emitting layer, so as to test the led-out light and adjust light emission;
    wherein the thin film transistor array layer comprises a gate insulation layer, a first planarization layer, an etching stop layer, a passivation layer, and a second planarization layer provided on the base substrate;
    a first opening is provided at a first position of the gate insulation layer, the first planarization layer is located in the first opening;
    a second opening is provided at a second position of the etching stop layer and the passivation layer, the second opening penetrates the etching stop layer and the passivation layer, a portion of the etching stop layer in the second opening forms a first etching stop sub-layer, the second planarization layer is filled between the first etching stop sub-layer and rest of the etching stop layer, a portion of the passivation layer in the second opening forms a first passivation sub-layer, the second planarization layer is filled between the first passivation sub-layer and rest of the passivation layer;
    the second planarization layer has a third opening at the second position to expose the first passivation sub-layer, the first etching stop sub-layer and the first passivation sub-layer constitutes the light guide, wherein the light guide further comprises an anode which is provided between the first passivation sublayer and the light emitting layer, wherein orthographic projections of the second and third openings on the base substrate fall within an orthographic projection of the first opening on the base substrate;

the brightness compensation method comprising steps of:
  collecting the brightness information of the light emitting layer in each pixel region;
  acquiring a measured grayscale brightness curve according to the brightness information;
  comparing the measured grayscale brightness curve with a standard grayscale brightness curve to acquire a grayscale compensation value of a preset grayscale;
  performing brightness compensation according to the grayscale compensation value.

* * * * *